(12) United States Patent
Jacobi et al.

(10) Patent No.: US 10,425,048 B2
(45) Date of Patent: *Sep. 24, 2019

(54) METHOD AND A DEVICE FOR DETECTING OSCILLATION AND SIGNAL COUPLING DEVICE

(71) Applicant: LAIRD DABENDORF GMBH, Zossen (DE)

(72) Inventors: Raimo Jacobi, Berlin (DE); Marcus Weigelt, Rangsdorf (DE); Khaled Bathich, Safat (KW)

(73) Assignee: Laird Dabendorf GmbH, Zossen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/113,260

(22) Filed: Aug. 27, 2018

(65) Prior Publication Data

US 2019/0267955 A1  Aug. 29, 2019

Related U.S. Application Data

(63) Continuation of application No. 15/908,046, filed on Feb. 28, 2018.

(51) Int. Cl.
| | |
|---|---|
| *H04B 17/00* | (2015.01) |
| *H03F 3/193* | (2006.01) |
| *H03F 3/21* | (2006.01) |
| *H03G 3/30* | (2006.01) |
| *H03F 1/26* | (2006.01) |

(52) U.S. Cl.
CPC ............ *H03F 3/193* (2013.01); *H03F 1/26* (2013.01); *H03F 3/21* (2013.01); *H03G 3/3036* (2013.01); *H04B 17/00* (2013.01)

(58) Field of Classification Search
CPC .. H03F 3/193; H03F 1/26; H03F 3/21; H03G 3/3036; H04B 17/00
USPC ...................................... 455/226.2
See application file for complete search history.

(56) References Cited

U.S. PATENT DOCUMENTS

| | | | |
|---|---|---|---|
| 6,912,426 B1 * | 6/2005 | Kerner ................ | G05B 13/042 318/607 |
| 7,486,929 B2 | 2/2009 | Van Buren et al. | |
| 8,755,399 B1 | 6/2014 | Van Buren et al. | |
| 9,054,664 B1 | 6/2015 | Ashworth et al. | |
| 2006/0209997 A1 | 9/2006 | Van Buren et al. | |
| 2008/0014862 A1 | 1/2008 | Van Buren et al. | |
| 2008/0014863 A1 | 1/2008 | Van Buren et al. | |
| 2011/0217943 A1 | 9/2011 | Ashworth et al. | |

(Continued)

*Primary Examiner* — Sonny Trinh
(74) *Attorney, Agent, or Firm* — Laurence A. Greenberg; Werner H. Stemer; Ralph E. Locher

(57) ABSTRACT

A method for detecting oscillation in a signal coupling device includes at least one oscillation detection step. The oscillation detection step includes the steps of determining an undamped signal level of a signal on a signal path of the signal coupling device in a first step, reducing a gain of the signal path in a second step, and determining a damped signal level of the signal on the signal path and a deviation between the undamped signal level and the damped signal level at least once in a third step. An oscillation is detected if at least one deviation determined in the third step of the at least one oscillation detection step is higher than or equal to a predetermined oscillation threshold value. A device for detecting oscillation in a signal coupling device and a signal coupling device are also provided.

17 Claims, 5 Drawing Sheets

(56) References Cited

U.S. PATENT DOCUMENTS

2015/0029909 A1  1/2015  Ashworth et al.
2018/0102861 A1* 4/2018  Ashworth et al. ..... H04B 17/40

* cited by examiner

METHOD AND A DEVICE FOR DETECTING OSCILLATION AND SIGNAL COUPLING DEVICE

CROSS-REFERENCE TO RELATED APPLICATIONS

The present application claims benefit of co-pending Non-Provisional patent application Ser. No. 15/908,046, filed on Feb. 28, 2018, entitled METHOD AND A DEVICE FOR DETECTING OSCILLATION AND SIGNAL COUPLING DEVICE, that application being incorporated herein, by reference, in its entirety.

BACKGROUND OF THE INVENTION

Field of the Invention

The invention relates to a method and a device for detecting oscillation and a signal coupling device, in particular for use in communication networks.

Signal coupling devices which couple a signal from a terminal device, e.g. a mobile device or a tablet, to an antenna, are known. Such signal coupling devices can e.g. include an amplifying device and or a damping device for amplifying or damping a signal transmitted by the terminal device or received by the antenna. Such signal coupling devices can e.g. be disposed in vehicles, in particular in automobiles. In that case, the signal coupling device can couple a terminal device to a vehicle antenna.

When using such a signal coupling device, signal oscillation can e.g. occur if a communication signal which is generated by the mobile device, transmitted to an input interface of the signal coupling device, amplified by the signal coupling device and then transmitted by the antenna arrives again at the signal input interface of the signal coupling device. In another scenario, a signal received by the antenna, amplified by the signal coupling device and transmitted from a signal interface of the signal coupling device to the terminal device, arrives again at the antenna. In such a case, the signal is amplified repeatedly which can cause an undesired signal oscillation.

Those oscillations can negatively affect a wanted signal and or a time synchronization of signals. It is therefore desirable to reduce or to avoid such signal oscillations. That is not only the case for signals transmitted through a signal coupling device but for communication networks in general.

U.S. Patent Application Publications US 2008/014862 A1 and US 2008/014863 A1 disclose a system and a method for optimal adjustment of gain of a network amplifier and for substantially reducing oscillation produced by a network amplifier.

A control circuit determines the optimal value of the amplification factors by analyzing the signals. In the event that an oscillation is detected, the control circuit adjusts the amplification factors in a manner that substantially reduces the oscillation.

U.S. Patent Application Publication US 2011/217943 A1 discloses an amplifier for optimizing a gain. The amplifier determines an optimal gain from inputs including the forward link and reverse link input power. The optimal gain may be accessed from a lookup table that accounts for characteristics of the amplifier, the cellphone (or other devices), and the base station (or base stations).

SUMMARY OF THE INVENTION

It is accordingly an object of the invention to provide a method and a device for detecting oscillation and a signal coupling device, which overcome the hereinafore-mentioned disadvantages of the heretofore-known methods and devices of this general type, in which the method and device detect oscillation in a reliable and fast manner and in which the signal coupling device transmits a signal between a terminal-sided signal interface and an antenna-sided signal interface which reliably and acutely detects oscillation.

A method for detecting oscillation in a signal coupling device is proposed. The signal coupling device can be a device for transmitting a signal, in particular a communication signal, between a terminal-sided signal interface of the device and an antenna-sided signal interface of the device. In particular, the signal coupling device can include at least one uplink signal path for connecting the terminal-sided signal interface of the device to the antenna-sided signal interface of the device. Further, the signal coupling device can include at least one downlink signal path for connecting the antenna-sided signal interface of the device to the terminal-sided signal interface. Through the uplink signal path, a signal generated by a terminal device, which can also be referred to as uplink signal, can be transmitted to the antenna. Through the downlink signal path, a signal received by the antenna, which can also be referred to as downlink signal, can be transmitted to the terminal device.

A terminal device can e.g. be a portable device such as a mobile phone or a tablet. The terminal-sided signal interface allows a transmission of signals between the signal coupling device and the terminal device, e.g. through a wireless transmission. The antenna-sided signal interface allows a signal transmission between at least one antenna and the signal coupling device, e.g. by a hard-wired transmission.

The signal coupling device can be disposed in a vehicle, in particular in an automobile. In this case, the at least one antenna can be a vehicle antenna. Such a signal coupling device is generally known as a Compenser or Compensator. Such a Compenser is e.g. manufactured by Laird Dabendorf GmbH in Germany. Such a signal coupling device can pick a telephone signal through near-field coupling and transmit it through cable through the signal coupling device to the exterior vehicle antenna. Such a signal coupling device can e.g. compensate for signal loss, thus ensuring outstanding data and voice transmission and improving the quality of calls.

With the foregoing and other objects in view there is provided, in accordance with the invention, a method for detecting oscillation in a signal coupling device, comprising at least one oscillation detection step, wherein the oscillation detection step includes the (sub-)steps of:

determining an undamped signal level of a signal on a signal path of the signal coupling device in a first step,
  reducing a gain of the signal path in a second step, and
  determining a damped signal level of the signal on the signal path and a deviation (value) between the undamped signal level determined in the first step and the damped signal level determined in the second step at least once in a third step.

The signal level can e.g. be determined by using a signal level determining device, e.g. by an adequate signal level sensor, e.g. a voltage or a current sensor. The signal path can be an uplink signal path, i.e. a signal path for transmitting an uplink-signal or TX signal from the terminal-sided signal interface to the antenna-sided signal interface, or a downlink signal path, i.e. a path for transmitting a downlink or RX signal from the antenna-sided signal interface to the terminal-sided signal interface.

The gain of the signal path can e.g. be adjusted by a device for changing the gain, in particular reducing the gain, of the signal path, e.g. an amplifying device or a damping device.

The deviation can e.g. be determined by using an evaluation unit. The evaluation unit can e.g. include or be provided by at least one processing unit, e.g. a microcontroller.

Further, an oscillation is detected e.g. by the evaluation unit, if at least one deviation (value) determined in the third step of the at least one oscillation detection step is higher than or equal to a predetermined oscillation threshold value. The predetermined oscillation threshold value can e.g. be determined in a calibration procedure or by simulations of the signal coupling device.

It is further possible to reverse the reduction of the gain, performed in the second step, in a fourth step of the oscillation detection step.

The proposed method advantageously allows a robust, reliable and fast detection of a signal oscillation since it only detects oscillation if the signal level tested repeatedly through the aforementioned steps always fulfills the criteria of an oscillation, e.g. the signal level or its time course does not deviate more than a predetermined amount from a predetermined value or course of an oscillation signal to be detected.

In another embodiment, the damped signal level and corresponding deviation values are determined repeatedly, wherein an oscillation is detected if all deviations determined in the third step of the at least one oscillation detection step are higher than or equal to the predetermined oscillation threshold value. In other words, the third step, the sequence of the second, the third step and the fourth step or the sequence of the first, the second, the third step and the fourth step is performed repeatedly, in particular n times wherein n can e.g. be higher than 1, in particular equal to 100.

This advantageously increases a robustness of the proposed method.

In another embodiment, the oscillation detection step is performed repeatedly, wherein an oscillation is detected if at least one or all deviation value(s) determined in the third step of each of the oscillation detection steps is/are higher than or equal to the predetermined oscillation threshold value. In other words, the deviation between the undamped signal level and the damped signal level is determined repeatedly. In particular, the oscillation detection step can be performed n times wherein n can be chosen application-dependent, e.g. it can be equal to 100. In general, the number n of times should not be chosen too high in order to provide a fast oscillation detection but also not too low in order to provide a robust oscillation detection.

This advantageously increases a robustness and reliability of the oscillation detection.

In another embodiment, the oscillation detection is started if a signal level of a signal on a signal path of the signal coupling device is higher than a predetermined starting threshold value and/or if a time derivative of the signal level is higher than a predetermined derivative threshold. In this case, the signal level on the signal path or the signal level on multiple signal paths, in particular on the uplink and downlink signal path, can be monitored repeatedly or continuously, even if no oscillation detection step is currently performed. This advantageously reduces the amount of resources, in particular computational resources, required for the oscillation detection since the oscillation detection is not performed continuously or repeatedly but only if a predetermined starting condition is fulfilled.

In another embodiment, an undamped signal level of a signal on the signal path of the signal coupling device is determined by determining the signal level of the signal on the signal path repeatedly and selecting the undamped signal level as the maximum signal level of the set of determined signal levels. The signal can e.g. be determined k times, wherein k is higher than 1, e.g. equal to 10 or 100. This means that a set of signal levels is determined in the undamped condition, wherein the undamped signal level is chosen at the maximum signal level of the set of signal levels. This advantageously increases a robustness and reliability of the proposed method.

In another embodiment, the signal on the signal path is an uplink signal, i.e. a TX-signal which is transmitted by the terminal device through the signal coupling device to the antenna.

In an alternative embodiment, the signal on the signal path is a downlink signal, i.e. a RX-signal which is received by the antenna and transmitted through the signal coupling device to the terminal device.

This advantageously allows detecting an oscillation in both possible modes, in particular in a TX mode and a RX mode of the terminal device.

In another embodiment, the oscillation threshold value is a frequency-specific or frequency band-specific value. It is possible that the signal coupling device can transmit signals within different frequency bands, in particular signals within up to 8 or even more signal frequency bands. In order to detect an oscillation of a signal in one specific band, a band-specific oscillation threshold value can be chosen. It is possible that for all frequency bands, a band-specific oscillation threshold value can be chosen. It is possible that all frequency band specific values are different from each other. It is, however, also possible that the oscillation threshold values of at least two frequency bands are equal to one another. The frequency band-specific values can e.g. be determined by a calibration or by a simulation. This advantageously allows a robust and reliable detection of oscillation in multiple frequency bands and thus increases an operability of the signal coupling device.

In another embodiment, the oscillation threshold value for detecting an oscillation of an uplink signal is different from the oscillation threshold value for detecting an oscillation of a downlink signal, in particular for uplink and downlink signals with the same frequency or within the same frequency band. In particular, the oscillation threshold value for detecting an uplink signal can be higher than the oscillation threshold value for detecting a downlink signal. This advantageously allows an increase of the reliability and robustness for detecting oscillation since the oscillation dynamics for uplink and downlink signals may be different from one another.

In another embodiment, the gain of the signal path is reduced by reducing the gain of an amplifying device within the signal path. Alternatively or in addition, the gain of the signal path is reduced by increasing a damping of a damping device within the signal path. In such a case, the signal path, e.g. the uplink or the downlink path, can include an amplifying device, e.g. an amplifier with an increasable gain. Alternatively or in addition, the signal path can include a damping device, e.g. an amplifier with a decreasable gain. A gain of such an amplifying device may be adjustable, e.g. by a control unit. The control unit can e.g. provide the aforementioned evaluation unit. A damping device can e.g. denote an amplifying device which allows only an decrease of the gain. The damping device can e.g. be a damping unit, also known as digital attenuator. Such a damping device is not capable of amplifying a signal but only of damping a signal. A damping factor of such a damping device can be adjustable, e.g. with the aforementioned control unit.

This allows an easy-to-implement implementation of the oscillation detection method since already built-in elements of the signal coupling device can be used, in particular existing amplifiers or attenuators.

With the objects of the invention in view, there is also provided a device for detecting oscillation in a signal coupling device. The device comprises at least one device for determining a signal level on a signal path, at least one device for reducing the gain of the signal path and at least one evaluation unit. Further, an oscillation detection step which is executable by the device includes the steps of:

determining an undamped signal level of a signal on the signal path of the signal coupling device in a first step,
reducing the gain of the signal path in a second step, and
determining a damped signal level of the signal in the signal path and a deviation (value) between the undamped signal level and the damped signal level at least once in a third step.

Further, an oscillation is detectable if at least one deviation value determined in the third step of the at least one oscillation detection step is higher than or equal to the predetermined oscillation threshold value.

The device can further include a memory unit for storing one or more threshold values. Further, the device can include at least one control unit for controlling the adaption of the gain of the signal path. The control unit can also provide the evaluation unit.

The device for determining the signal level on a signal path can e.g. be provided by a signal level sensing device, e.g. a signal coupling device which decouples the signal from the signal path and a detection device which detects the signal level of the decoupled signal. The device for reducing the gain can e.g. be provided by an amplifier and or a digital attenuator.

The device is configured in such a way that a method according to one of the embodiments described herein can be performed by the proposed device. The elements of the device, namely the device for determining the signal level, the at least one device for reducing the gain and the at least one evaluation unit can be elements of a signal coupling device. Thus, the device for detecting oscillation can be provided by already existing elements of such a signal coupling device. Such a device advantageously allows the performance of a robust and reliable detection of oscillation.

In another embodiment, the device includes at least one amplifying device for amplifying a signal on a signal path and/or at least one damping device for damping a signal on a signal path. This and corresponding advantages have been explained above.

With the objects of the invention in view, there is furthermore provided a signal coupling device for transmitting a signal between a terminal-sided signal interface of the device and an antenna-sided interface of the device, wherein the device comprises at least one signal path for connecting the terminal-sided signal interface to the antenna-sided signal interface. Such a signal coupling device has been described above.

Further, the device includes a device for detecting oscillation according to one of the embodiments described herein. This advantageously allows the provision of a signal coupling device which also allows for a reliable and robust detection of oscillation.

In another embodiment, the signal coupling device includes at least one uplink-signal path for connecting the terminal-sided signal interface of the device to the antenna-sided signal interface of the device, wherein the uplink signal path includes at least one amplifying device for amplifying an uplink signal. Further, the at least one device for determining a signal level on the signal path is disposed and/or configured in such a way that a signal level of the output signal of the amplifying device is determinable. It is e.g. possible that a signal output of the amplifying device is connected to the antenna-sided signal interface or to a switching unit which allows a connection to different uplink signal paths to the antenna-sided signal interface.

This advantageously allows a robust and reliable determination of oscillation within the signal coupling device.

In another embodiment, the signal coupling device includes at least one downlink signal path for connecting the antenna-sided signal interface of the device to the terminal-sided signal interface of the device, wherein the downlink signal path includes at least one amplifying device for amplifying a downlink signal, wherein at least one device for determining a signal level on a signal path is disposed and/or configured in such a way that the signal level of the output signal of the amplifying device is determinable. It is possible that a signal output of the amplifying device of the downlink signal path is directly connected to the terminal-sided signal interface or to a switching unit which allows a connection to different downlink-signal paths to the terminal-sided signal interface.

This advantageously allows a robust and reliable detection of oscillation within a downlink signal path of the signal coupling device.

In another embodiment, the device includes at least one amplifying device for amplifying a signal on the signal path for connecting the terminal-sided signal interface to the antenna-sided signal interface and/or at least one damping device for damping a signal on the signal path for connecting the terminal-sided signal interface to the antenna-sided signal interface. This and corresponding advantages have been described above.

Further, described is a computer program product with a computer program, where the computer program includes software for the execution of the method for detecting oscillation in a signal coupling device according to one of the embodiments described herein if the computer program is executed by or in an automation system, e.g. a control unit.

Further described is a program which, running on a computer, causes the computer to perform one or more or all steps of a method for detecting oscillation described herein and/or the program stored medium on which the program is stored (in particular in a non-transitory form) and/or a computer including a set program storage medium or a (physical for example electrical, for example technically generated) signal wave, for example a digital signal wave, carrying information which represents the program, for example the aforementioned program, which for example includes code which are adapted to perform any or all of the methods steps described herein.

This means that a method in accordance with the invention is for example a computer-implemented method. For example, all the steps and/or some of the steps (i.e. less than the total number of the steps) of the method in accordance with the invention can be executed by a computer. An embodiment of the computer-implemented method is a use of the computer for performing a data processing method. The computer for example includes a least one processor and for example at least one memory in order to (technically) process the data, for example electronically and or optically.

Other features which are considered as characteristic for the invention are set forth in the appended claims.

Although the invention is illustrated and described herein as embodied in a method and a device for detecting oscillation and a signal coupling device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
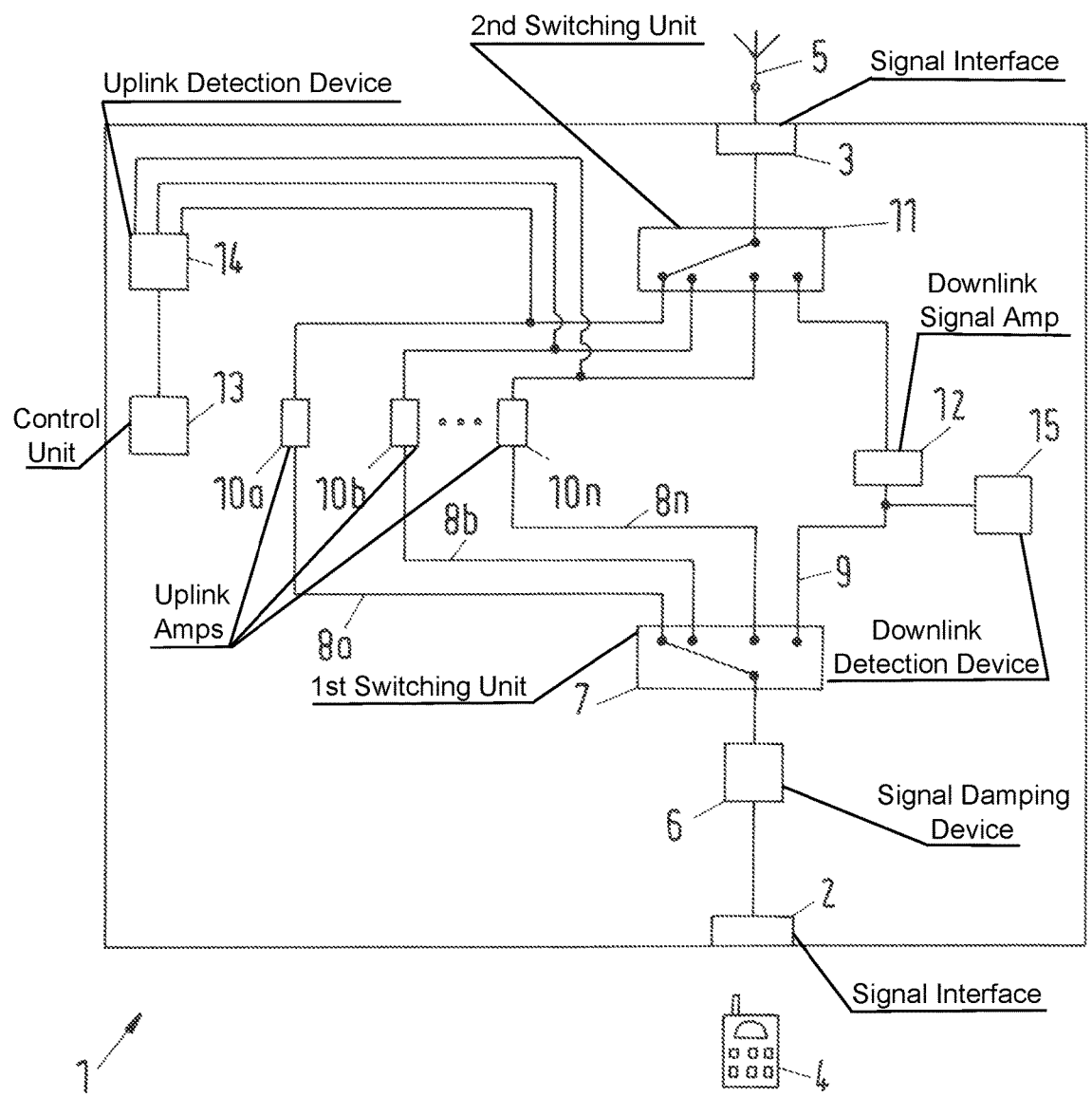
FIG. 1 is a schematic and block diagram of a signal coupling device.

Referring now in detail to the figures of the drawings, in which the same reference numerals denote elements with the same or similar technical features, and first, particularly, to FIG. 1 thereof, there is seen a schematic block diagram of a signal coupling device 1, wherein the signal coupling device 1 includes a device for detecting oscillation.

The signal coupling device 1 is a device for transmitting a signal between a terminal-sided signal interface 2 of the device 1 and an antenna-sided signal interface 3 of the device 1. The terminal-sided signal interface 2 can be an interface for transmitting signals, e.g. in a wireless manner, between the device 1 and a terminal device 4, e.g. a portable device such as a mobile phone. The antenna-sided signal interface 3 can be an interface for transmitting signals between a device 1 and an antenna 5, e.g. in a hard-wired manner.

The signal coupling device 1 includes at least one signal path for connecting the terminal-sided signal interface 2 to the antenna-sided signal interface 3. In particular, the signal coupling device 1 includes multiple uplink signal paths for transmitting signals from the terminal-sided signal interface 2 to the antenna-sided signal interface 3 of the device 1. These uplink signal paths are used to transmit signals generated by the terminal device 4 to the antenna 5.

Further shown is a downlink signal path for connecting the antenna-sided signal interface 3 to the terminal-sided signal interface 2. This downlink signal path is used for transmitting signals from the antenna 5 to the terminal device 4.

In addition to the interfaces 2, 3, the signal coupling device 1 includes a signal damping device 6 which can also be referred to as digital attenuator. Such a damping device can be defined as an amplifier with a variable gain. The damping device 6 is connected to the terminal-sided signal interface 2 and to a terminal-sided first switching unit 7. Through the use of the first switching unit 7, the signal path connecting the switching unit 7 and the damping device 6 can be connected to a plurality of uplink signal path sections 8a, 8b, 8n. Further, the signal path section connecting the damping device 6 and the switching unit 7 can also be connected to a downlink signal path section 9.

Further, the signal coupling device 1 includes uplink signal amplifiers 10a, 10b, . . . , 10n. The uplink signal path sections 8a, 8b, . . . 8n include these amplifiers 10a, 10b, . . . 10n. A gain of these amplifier 10a, 10b, . . . 10n can be variable and adjustable.

The uplink signal path sections 8a, 8b, . . . 8n including the uplink signal amplifiers 10a, 10b, . . . 10n are connected to an antenna-sided second switching unit 11. Through this antenna-sided second switching unit 11, one of the uplink signal path sections 8a, 8b, . . . 8n or the downlink signal path section 9 is connectable to a signal path section connecting the second switching unit 11 to the antenna-sided signal interface 3. Through different uplink signal path sections 8a, 8b, 8n, uplink signals with frequencies disposed in different frequency bands can be transmitted.

Further shown is that the downlink signal path section 9 includes a downlink signal amplifier 12. A gain of the downlink signal amplifier 12 can be variable and adjustable. Further, the signal coupling device 1 includes a control unit 13, wherein the control unit 13 can e.g. be provided or include at least one microcontroller. The control unit 13 can e.g. control an operation of the damping device 6, the uplink signal amplifiers 10a, 10b, . . . 10n, the downlink signal amplifier 12, the terminal-sided first switching unit 7 and the antenna-sided second switching unit 11.

Further, the signal coupling device 1 includes a device 14 for determining an uplink signal level. Further, the signal coupling device 1 includes a device 15 for determining a downlink signal level. These devices 14, 15 for determining the signal level can e.g. include signal couplings devices for coupling the signals on the respective signal path sections 8a, 8b, . . . 8n, 9 to the respective devices 14, 15. Such a signal coupling device can e.g. be constructed as a power coupler. It is further possible that the device 14 for determining an uplink signal level is connected to the uplink signal path sections 8a, 8b, . . . 8n through so-called daisy chain configuration.

Further, a device 14, 15 can include rectifying devices, e.g. constructed as a rectifier. Through the use of the devices 14, 15 for determining a signal level, it is e.g. possible to generate a signal, in particular DC voltage signal, which represents the signal level of the signal on the respective uplink signal path sections 8a, 8b, . . . 8n or downlink path section 9.

The devices 14, 15 are connected to the control unit 13 by a signal connection. Thus, it is possible that the control unit 13 can analyze or evaluate the respective signal level determined by the devices 14, 15.

A device for detecting oscillation can include the control unit 13, the devices 14, 15 for determining signal levels as well as the damping device 6 and/or the uplink signal amplifiers 10a, 10b, . . . 10n as well as the downlink signal amplifier 12.

Figure 2:
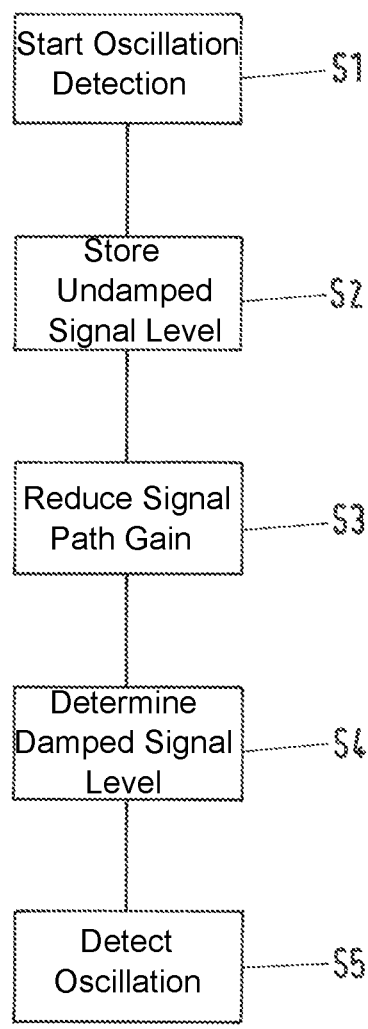
FIG. 2 is a schematic flow diagram of a method for detecting oscillation according to a first embodiment.
Figure 3:
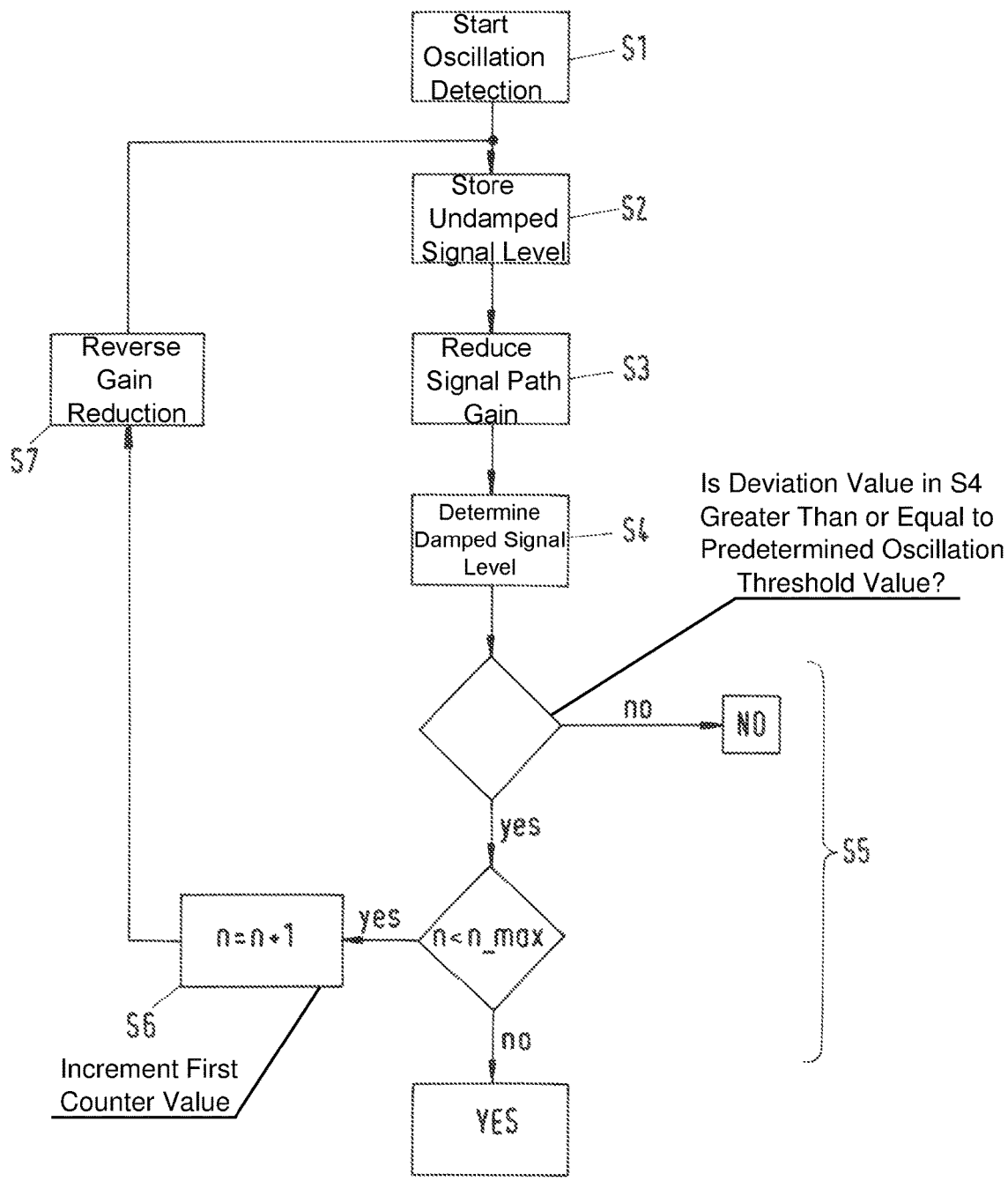
FIG. 3 is a schematic flow diagram of a method for detecting according to another embodiment.
Figure 4:
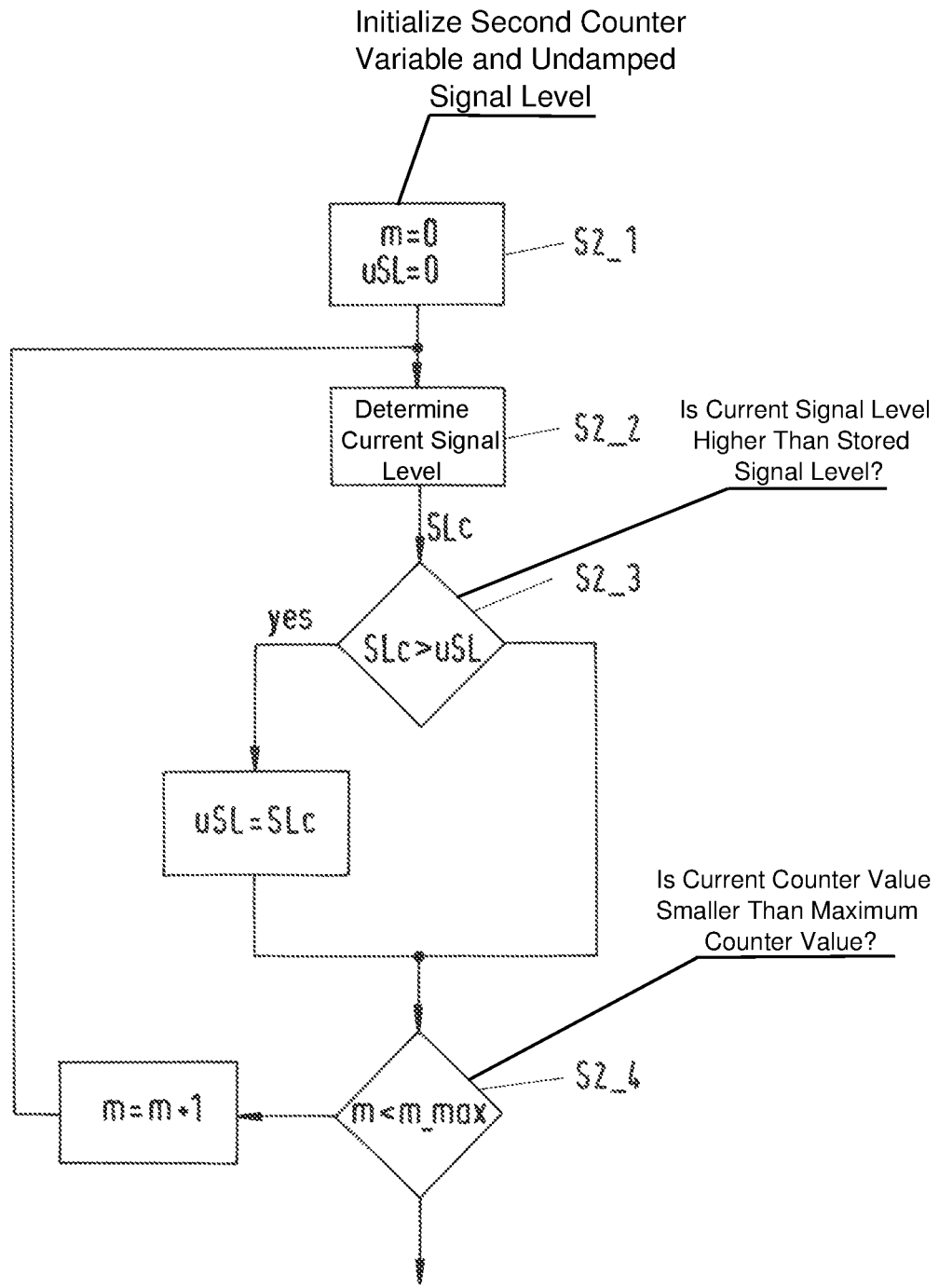
FIG. 4 is a schematic flow diagram of a first step of an oscillation detection method.

The device for detecting oscillation can perform a method for detecting oscillation according to one of the embodiments described herein, in particular a method shown in an exemplary manner in FIG. 2 to FIG. 4.

FIG. 2 shows a schematic flow diagram of a method for detecting oscillation according to the invention. In a first step S1 the execution of an oscillation detection step is started. The oscillation detection e.g. can be started if a signal level of a downlink signal on the downlink signal path section 9 (see FIG. 1) or of an uplink signal on an uplink signal path section 8a, 8b, ... 8n is higher than a predetermined starting threshold value. It is e.g. possible that the control unit 13 (see FIG. 1) monitors the corresponding signal levels on the uplink and downlink signal path sections 8a, 8b, ... 8n, 9 by using the devices 14, 15 for determining a signal level. The predetermined starting threshold value can e.g. be determined by calibration or simulation. The threshold value can be stored, e.g. in a memory unit of the control unit.

If the oscillation detection is started in the first step S1, an undamped signal level of an uplink or downlink signal on the respective signal path section 8a, 8b, ... 8n, 9 is determined. A second step S2 thus corresponds to a first step of the oscillation detection step. The undamped signal level can be stored, e.g. in a memory unit of the control unit.

In a third step S3, a gain of the respective signal path 8a, 8b ... 8n, 9 is reduced. The third step S3 can correspond to a second step of the oscillation detection step. Reducing the gain of the signal path can e.g. be performed by reducing the amplification factor of an uplink signal amplifier 10, 10b, ... 10n (see FIG. 1) or of the downlink signal amplifier 12. Alternatively or in addition, a damping factor of a damping device 6 (see FIG. 1) can be increased. Reducing the gain or the amplification factor or increasing the damping factor can e.g. be controlled by the control unit 13.

In a fourth step S4, which corresponds to a third step of the oscillation detection step, a damped signal level of the respective uplink or downlink signal on the uplink or downlink signal path section 8a, 8b, ... 8n, 9 is determined, e.g. by using the devices 14, 15 for determining signal level.

It is possible that the damped signal level is also stored in the aforementioned memory unit. Further, a deviation value between the undamped signal level determined in the second step S2 and the damped signal level determined in the fourth step S4 is determined by e.g. the control unit 13.

In a fifth step S5 an oscillation is detected if the deviation value determined in the fourth step S4 (i.e. the third step of the at least one oscillation step) is higher than or equal to the predetermined oscillation threshold value. The oscillation threshold value can e.g. be determined by calibration or a simulation can also be stored in a memory unit of the control unit.

If oscillation is detected in the fifth step S5 corresponding routines can be initiated or performed, in particular for interrupting or terminating the oscillation. It is e.g. possible that a gain of the signal uplink or downlink signal path is reduced, e.g. by further reducing the variable gains of the uplink or downlink signal amplifiers 10a, ... 10n, 12 or by shutting off or deactivating the amplifiers 10a, 10b, ... 10n, 12.

It is possible that after the determination of the damped signal level and before or simultaneously with the determination of the deviation value, the reduction of the gain in the third step S3 is reversed, e.g. in the fourth or the fifth step S4, S5. This can also be performed by the control unit 13.

FIG. 3 shows a schematic flow diagram of a method for detecting oscillation according to another embodiment of the invention. Shown are the first step S1, the second step S2, the third step S3, the fourth step S4 which correspond to steps S1, S2, S3, S4 of the embodiment shown in FIG. 2. In the first step S1, a first counter variable n can be initialized, e.g. set to the value of zero.

In a fifth step S5, it is first determined if a deviation value determined in the fourth step S4 is higher than or equal to a predetermined oscillation threshold value (first substep).

If this is not the case, no oscillation is detected and the method is terminated. If the deviation is higher than or equal to the predetermined oscillation threshold value, a second substep of the fifth step S5 is performed.

In this second substep it is determined whether the first counter variable n is smaller than a predetermined maximum counter value n_max. If this is the case, the first counter value n is incremented by a predetermined increment, e.g. one, in a sixth step S6. In a seventh step S7, the gain reduction performed in a third step S3 is reversed and the oscillation detection step including the second to the fourth steps S2, S3, S4 and the fifth step S5 is performed again. If the first counter variable n is equal to the maximum counter value n_max, the method is terminated and an oscillation is detected.

FIG. 4 shows a schematic flow diagram of the second step S2 shown in the embodiments according to FIG. 2 and FIG. 3, namely of the first step of the oscillation detection step. In a first substep S2_1, a second counter variable m is initialized, e.g. set to the value of zero. Further, an undamped signal level uSL is initialized, e.g. set to the value of 0. This undamped signal level uSL is stored, e.g. in a memory unit. In a second substep S2_2, the current signal level SLc, i.e. the current, undamped signal level of a signal of an uplink or downlink signal path of the signal coupling device 1 is determined.

In a third substep S2_3 it is tracked whether the current signal level SLc is higher than the stored undamped signal level uSL. If this is the case, the stored undamped signal level uSL is set to the current signal level SLc which has been measured in the second substep S2_2. If this is not the case, no further action is performed. In a fourth substep S2_4, it is compared whether the current counter value of the second counter variable m is smaller than a maximum counter value m_max which can e.g. be a predetermined counter value. If this is the case, the counter value is incremented by an increment, e.g. by the value of one.

Then, the sequence of substeps starting with the second substep S2_2 is performed again. If the counter value of the second counter variable m is higher than the maximum counter value, the second step S2, (i.e. the first step of the oscillation detection step) is terminated.

Figure 5:
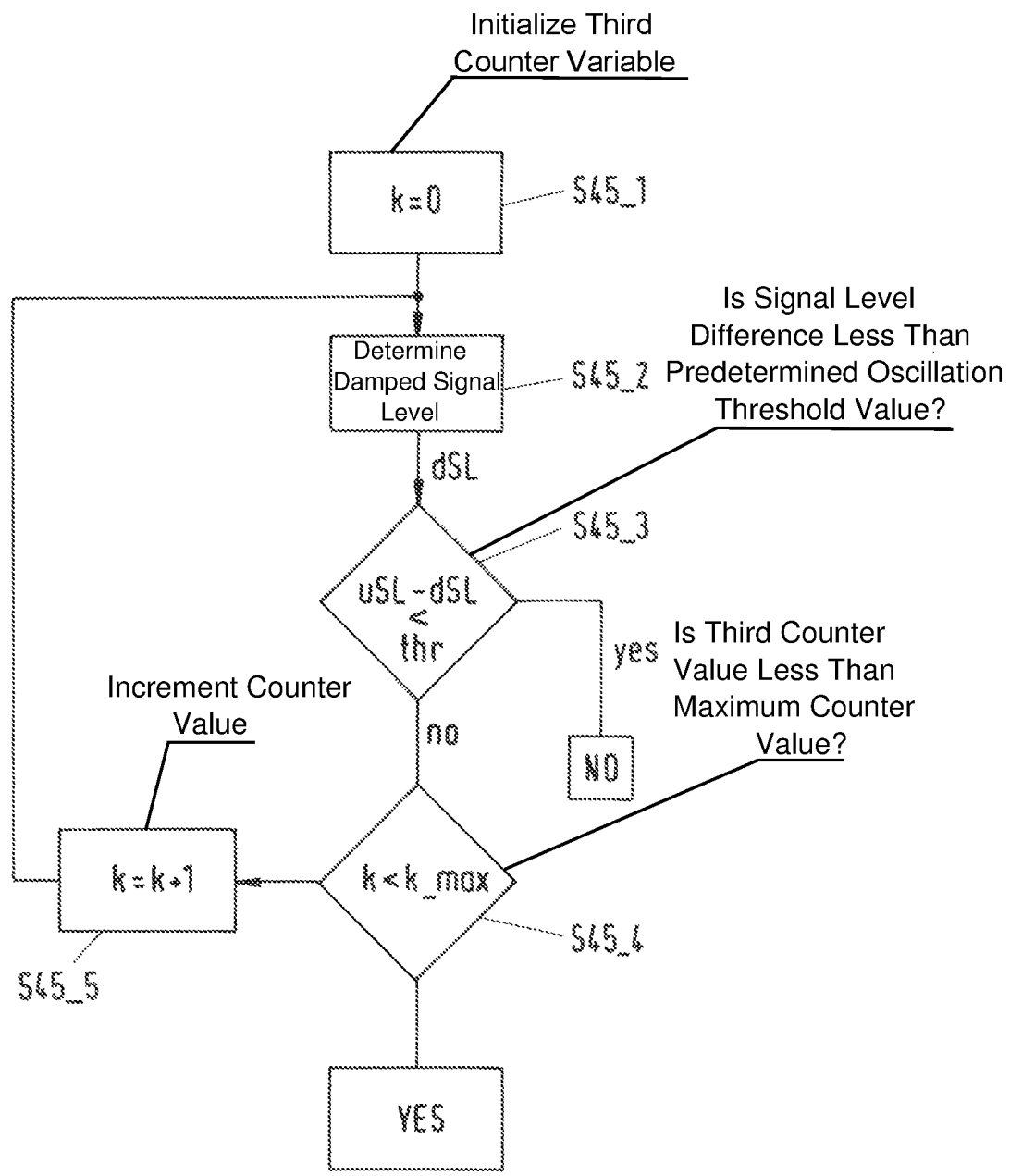
FIG. 5 is a schematic flow diagram of fourth and fifth steps of the embodiment shown in FIG. 2 and FIG. 3 according to another embodiment of the invention.

FIG. 5 shows a schematic flow diagram of the fourth and the fifth steps S4, S5 of the embodiment shown in FIG. 2 and FIG. 3 according to another embodiment of the invention.

In a first substep S45_1, a value of a third counter variable k is initialized, e.g. set to the value of zero. In a second substep S45_2, a damped signal level dSL is determined. In a third substep S45_3, an absolute value of the difference between the aforementioned (stored) undamped signal level uSL and the damped signal level dSL is determined and compared to the predetermined oscillation threshold value thr.

If the absolute value of the difference is smaller than the predetermined oscillation threshold value thr, no oscillation is detected and the method is terminated. If the absolute value of the difference is not smaller than the predetermined oscillation threshold value thr, the current value of the third counter value k is compared to a predetermined maximum counter value k_max in a fourth step S45_4. If the counter value k is smaller than the maximum counter value k_max, the counter value k is incremented in a fifth step S45_5 and the sequence including the second, the third and the fourth substeps S45_2, S45_3, S45_4 is performed again. If the counter value k is not smaller than the maximum counter value k_max, an oscillation is detected.

The invention claimed is:

1. A method for detecting oscillation in a signal coupling device, the method comprising the following steps:
   carrying out at least one oscillation detection step including:
      determining an undamped signal level of a signal on a signal path of the signal coupling device in a first step;
      reducing a gain of the signal path in a second step;
      repeatedly determining a damped signal level of the signal on the signal path and a deviation between the undamped signal level and the damped signal level in a third step;
   detecting an oscillation if all deviations determined in the third step of the at least one oscillation detection step are higher than or equal to a predetermined oscillation threshold value;
   repeatedly performing the oscillation detection step, and detecting an oscillation if at least one or all deviations determined in the third step of each of the oscillation detection steps is or are higher than the predetermined oscillation threshold value; and
   starting the oscillation detection upon an occurrence of at least one of:
      a signal level of a signal on a signal path of the signal coupling device being higher than a predetermined starting threshold value, or
      a time derivative of the signal level being higher than a predetermined signal edge threshold.

2. The method according to claim 1, which further comprises determining an undamped signal level of a signal on a signal path of the signal coupling device by repeatedly determining the signal level of the signal on the signal path and selecting the undamped signal level as a maximum signal level of the determined signal levels.

3. The method according to claim 1, which further comprises determining an undamped signal level of a signal on a signal path of the signal coupling device by repeatedly determining the signal level of the signal on the signal path and selecting the undamped signal level as a maximum signal level of the determined signal levels.

4. The method according to claim 1, which further comprises determining an undamped signal level of a signal on a signal path of the signal coupling device by repeatedly determining the signal level of the signal on the signal path and selecting the undamped signal level as a maximum signal level of the determined signal levels.

5. The method according to claim 1, which further comprises providing the signal on the signal path as an uplink signal.

6. The method according to claim 1, which further comprises providing the signal on the signal path as a downlink signal.

7. The method according to claim 1, which further comprises providing the oscillation threshold value as a frequency-specific or frequency band-specific value.

8. The method according to claim 1, which further comprises selecting the oscillation threshold value for detecting an oscillation of an uplink signal to be different than the oscillation threshold value for detecting an oscillation of a downlink signal.

9. The method according to claim 1, which further comprises selecting the oscillation threshold value for detecting an oscillation of an uplink signal to be different than the oscillation threshold value for detecting an oscillation of a downlink signal, for uplink and downlink signals of an identical frequency band.

10. The method according to claim 1, which further comprises reducing the gain of the signal path by at least one of reducing a gain of an amplifying device within the signal path or increasing a damping of a damping device within the signal path.

11. A device for detecting oscillation in a signal coupling device, the device comprising:
    at least one device for determining a signal level on a signal path;
    at least one device for reducing a gain of the signal path; and
    at least one processing unit for executing an oscillation detection step including:
       determining an undamped signal level of a signal on the signal path of the signal coupling device in a first step,
       reducing a gain of the signal path in a second step,
       repeatedly determining a damped signal level of the signal on the signal path and a deviation between the undamped signal level and the damped signal level at least once in a third step,
    detecting an oscillation if all deviations determined in the third step of the at least one oscillation detection step are higher than or equal to a predetermined oscillation threshold value;
    repeatedly performing the oscillation detection step, and detecting an oscillation if at least one or all deviations determined in the third step of each of the oscillation detection steps is or are higher than the predetermined oscillation threshold value; and
    starting the oscillation detection upon an occurrence of at least one of:
       a signal level of a signal on a signal path of the signal coupling device being higher than a predetermined starting threshold value, or
       a time derivative of the signal level being higher than a predetermined signal edge threshold.

12. The device for detecting oscillation according to claim 11, which further comprises at least one of at least one amplifying device for amplifying a signal on the signal path or at least one damping device for damping a signal on the signal path.

13. A signal coupling device for transmitting a signal between a terminal-sided signal interface of the device and an antenna-sided signal interface of the device, the signal coupling device comprising:
    at least one signal path for connecting the terminal-sided signal interface to the antenna-sided signal interface; and
    a device according to claim 11 for detecting oscillation.

14. The signal coupling device according to claim 13, which further comprises at least one uplink signal path for connecting the terminal-sided signal interface of the device to the antenna-sided signal interface of the device, said uplink signal path including at least one amplifying device for amplifying an uplink signal, and said at least one device for determining a signal level on a signal path being at least one of disposed or configured to determine a signal level of an output signal of said at least one amplifying device.

15. The signal coupling device according to claim 13, which further comprises at least one downlink signal path for connecting the antenna-sided signal interface of the device to the terminal-sided signal interface of the device, said downlink signal path including at least one amplifying device for amplifying a downlink signal, and said at least one device for determining a signal level on a signal path being at least one of disposed or configured to determine a signal level of an output signal of said at least one amplifying device.

16. The signal coupling device according to claim 15, which further comprises at least one of at least one amplifying device for amplifying a signal on the signal path for connecting the terminal-sided signal interface to the antenna-sided signal interface or at least one damping device for damping a signal on the signal path for connecting the terminal-sided signal interface to the antenna-sided signal interface.

17. The signal coupling device according to claim 13, which further comprises at least one of at least one amplifying device for amplifying a signal on the signal path for connecting the terminal-sided signal interface to the antenna-sided signal interface or at least one damping device for damping a signal on the signal path for connecting the terminal-sided signal interface to the antenna-sided signal interface.

* * * * *